(12) United States Patent
Gracia et al.

(10) Patent No.: US 6,232,031 B1
(45) Date of Patent: May 15, 2001

(54) POSITIVE-WORKING, INFRARED-SENSITIVE LITHOGRAPHIC PRINTING PLATE AND METHOD OF IMAGING

(75) Inventors: Robert F. Gracia, Woodstock; Yijin Ren, Ellington; William J. Rozell, Vernon; Howard A. Fromson, Stonington, all of CT (US)

(73) Assignee: Ano-Coil Corporation, Rockville, CT (US)

( * ) Notice: Subject to any disclaimer, the term of this patent is extended or adjusted under 35 U.S.C. 154(b) by 0 days.

(21) Appl. No.: 09/539,072

(22) Filed: Mar. 30, 2000

Related U.S. Application Data

(63) Continuation of application No. 09/436,289, filed on Nov. 8, 1999, now abandoned.

(51) Int. Cl.[7] .............................. G03F 7/023; G03F 7/30
(52) U.S. Cl. ......................... 430/165; 430/190; 430/191; 430/192; 430/193; 430/302
(58) Field of Search .................................... 430/165, 190, 430/191, 192, 193, 302

(56) References Cited

U.S. PATENT DOCUMENTS

| | | | |
|---|---|---|---|
| 4,708,925 | 11/1987 | Newman | 430/270 |
| 5,705,308 | 1/1998 | West et al. | 430/165 |
| 5,705,309 | 1/1998 | West et al. | 430/167 |
| 5,705,322 | 1/1998 | West et al. | 430/325 |
| 5,962,192 | 10/1999 | Holman, III et al. | 430/302 |
| 6,060,217 * | 5/2000 | Nguyen et al. | 430/302 |

FOREIGN PATENT DOCUMENTS

| | | |
|---|---|---|
| WO 96/20429 | 7/1996 | (WO) . |
| WO 97/39894 | 10/1997 | (WO) . |
| WO 99/01796 | 1/1999 | (WO) . |

OTHER PUBLICATIONS

A. Reiser, "The Molecular Mechanism of Novolak Resists", Journal of Imaging Science and Technology, vol. 42, No. 1, pp. 15–22.

* cited by examiner

*Primary Examiner*—John S. Chu
(74) *Attorney, Agent, or Firm*—Alix, Yale & Ristas, LLP

(57) ABSTRACT

A positive-working, infrared imageable coating and a lithographic printing plate or other element with the coating are described. The coating is a phenolic resin containing an o-diazonaphthoquinone derivative which couples or reacts with the resin to partially insolubilize the coating and an infrared absorbing dye or pigment which further insolubilizes the coating and which renders the coating imageable by infrared radiation. The coating contains only that quantity of infrared radiation absorber necessary to be imageable and only that small quantity of o-diazonaphthoquinone derivative necessary to supplement the insolubilizing function of the absorber. Specifically, the absorber is from 1 to 10 weight percent of the total dry weight of the coating and the dry weight ratio of the absorber to the diazonaphthoquinone moiety is greater than 1:5 and preferably 1:2 or greater. By replacing a portion of expensive dye with some less expensive o-diazonaphthoquinone derivative to obtain the necessary degree of insolubility, the cost of the coating is greatly reduced.

14 Claims, No Drawings

POSITIVE-WORKING, INFRARED-SENSITIVE LITHOGRAPHIC PRINTING PLATE AND METHOD OF IMAGING

This application is a continuing application of U.S. patent application Ser. No. 09/436,289 filed Nov. 8, 1999 abandoned.

BACKGROUND OF THE INVENTION

This invention relates to an infrared sensitive composition and to a positive-working element using such a composition. More particularly, this invention relates to positive-working lithographic printing plates.

Lithographic printing depends upon the immiscibility of oily ink and water with the ink being retained on the oleophilic image areas of the plate and the water being retained on the hydrophilic non-image areas. Most lithographic printing plates have a radiation-sensitive coating applied to an aluminum printing plate substrate. These coatings can be selected to be sensitive to a wide range of radiations including ultraviolet radiation, visible radiation and infrared radiation. The coating may react to the radiation such that the portions of the coating exposed become soluble and are removed during development, thus becoming hydrophilic non-image areas. Such plates are known as positive-working printing plates. On the other hand, the coating may react to the radiation such that the exposed areas become hardened and insoluble and remain during development, becoming the oleophilic image areas. Such plates are known as negative-working printing plates.

One prior art lithographic plate of the negative-working type is described in U.S. Pat. No. 5,705,308. The coating is an infrared imaging composition containing a phenolic resin that is either mixed with or reacted with an o-diazonaphthoquinone derivative and which also contains a specific infrared radiation absorber.

Another prior art lithographic plate which is related but which is of the positive-working type is described in U.S. Pat. No. 5,858,626. The coating is also an infrared imaging composition containing a phenolic resin that is either mixed with or reacted with an o-diazonaphthoquinone derivative and which also contains an infrared radiation absorber. In this patent, the dry weight ratio of o-diazonaphthoquinone moiety to the infrared absorber in the coating composition is quite high and the diazonaphthoquinone moiety is at least 5 weight percent and more preferably 15 to 40 weight percent of the coating.

In the PCT International Application Publication Number WO 96/20429, another coating is described which is a naphthoquinone diazide ester of a phenolic resin or a naphthoquinone diazide ester mixed with a phenolic resin containing an infrared absorber. The plate is blanket (overall) exposed to ultraviolet radiation which solubilizes the entire coating as with a positive-working plate. The plate is then laser imaged to insolubilize the coating in the image areas as with a negative-working plate.

In the PCT International Application Publication Number WO 97/39894, the coating is an alkali soluble phenolic resin containing a compound which complexes with the resin and reduces the solubility. The coating also contains an infrared absorber which may also be the complexing compound. When exposed, the heating breaks down the complex so that the exposed areas become soluble. The complexing compound increases the solubility differential between the exposed and unexposed areas. The solubility of the coating is not affected by ultraviolet radiation.

Further prior art is disclosed in U.S. Pat. No. 5,962,192 which discloses a positive-working plate having a polymeric resin coating containing an organo azide compound and an infrared radiation sensitive dye. In this patent, the suitable resins are polyvinyl formal, acrylates, methacrylates and styrene. The radiation is absorbed by the dye to raise the temperature above the decomposition temperature of the organo azide. The plate is then blanket exposed to ultraviolet radiation which hardens the coating in the areas which were not exposed to the infrared radiation. This blanket exposure is necessary to increase the solubility contrast between the infrared exposed and non-exposed areas to a practical, workable level. The infrared exposed, non-image areas of the coating are then dissolved away. Alternately, the coating can first be blanket exposed to cross link and harden the coating. The coating is then infrared exposed in the non-image areas to solubilize the coating in those areas. An acidic organic solvent is used in the development process.

SUMMARY OF THE INVENTION

The invention relates to a positive-working coating composition and to a lithographic printing plate formed with a coating of that composition. The object is to provide an infrared imageable lithographic printing plate having a phenolic resin coating containing an o-diazonaphthoquinone derivative coupled to or reacted with the resin and an infrared radiation absorbing compound. More specifically, the invention provides a low cost plate with a resin coating containing a quantity of infrared absorber sufficient to be infrared imageable but with only a low level of o-diazonaphthoquinone derivative loading. More specifically the o-diazonaphthoquinone moiety comprises less than 5 weight percent and preferably about 2.5 weight percent of the dried coating and the dry weight ratio of the infrared absorber to the o-diazonaphthoquinone moiety is greater than 1:5 and preferably 1:2 or greater. The most preferred ratio is about 3:1.

DESCRIPTION OF THE PREFERRED EMBODIMENTS

The coating of the invention is particularly suitable for lithographic printing plates and the invention will be described in that environment. However, it is recognized that the coating can be used with other substrates such as for imageable printed circuit boards. With respect to lithographic printing plates, the substrate is most commonly a conventional grained and anodized aluminum substrate although other metal substrates can be used. For a teaching of one type of graining process, see U.S. Pat. No. 4,183,788 to Fromson et al and for a teaching of anodizing see U.S. Pat. RE 29754 to Fromson.

The basic and predominant component of the coating of the invention is a film-forming resin of the type normally used for lithographic printing plate coatings. These resins are light-stable, water-insoluble and alkali soluble. The typical resins are polyhydroxy polymers capable of forming hydrogen bonds with o-diazonaphthoquinones such as novolac resins, resole resins and polyvinyl resins with phenolic hydroxide groups. Novolac resins such as phenol formaldehyde resin and cresol formaldehyde resin are preferred.

The resin coating of the invention contains two essential components. The first is the o-diazonaphthoquinone derivative which interacts with the resin to insolubilize the resin coating in the typical alkaline developers. The o-diazonaphthoquinone derivative may be mixed with and merely couple with the resin by hydrogen bonding or it may be an o-diazonaphthoquinone derivative which has a functional group, such as chloride or imide groups, that can react with a reactive group of the resin and become part of the resin. In either case, the result is to insolubilize the coating. The preferred embodiment of the invention employs an o-diazonaphthoquinone derivative which is mixed with the resin and hydrogen bonds. The second component is the infrared radiation absorbing compound which also couples with the resin by hydrogen bonding to insolubilize the resin coating. The infrared radiation absorbing compound is usually a dye compound but pigments can also be used. The use of the term dye herein is intended to include both dyes and pigments. The dye compound also serves the function of absorbing the infrared imaging radiation to produce heat which decouples the components from the resin and thereby solubilizes the coating in the exposed areas. Because both of these components function to insolubilize the coating, it has been found that a positive-working coating can be prepared which is infrared imageable but which has such a low sensitivity to ultraviolet light that it can be handled in daylight at least for some periods of time. The coating contains only that quantity of infrared radiation absorbing dye necessary to be imageable in that mode and only that small quantity of o-diazonaphthoquinone derivative necessary to supplement the insolubilizing function of the dye to produce the required level of insolubility. Since the cost of infrared-absorbing dyes is high and the cost of the o-diazonaphthoquinone derivatives is relatively low, replacing a portion of the dye which would otherwise be required with a quantity of the o-diazonaphthoquinone derivative significantly reduces the cost of the coating. As a comparison, the PS 105 diazonaphthoquinone sensitizer used in the examples given later is about $282 per kilogram whereas the cost of the 830 A infrared-absorbing dye is about $6,250 per kilogram. The quantity of dye necessary in the coating is from 1 to 10 weight percent of the total dry coating weight and the dry weight ratio of the dye to the o-diazonaphthoquinone moiety is greater than 1:5 and preferably 1:2 or greater. The most preferred ratio is about 3:1. At any of these ratios, the cost saving from the invention is large.

The o-diazonaphthoquinone derivatives have at least one o-diazonaphthoquinone group or moiety in the molecule and they are prepared from compounds well known in the art. They are usually esters or amides with a suitable aromatic polyhydroxy compound or an amine. Examples are the esters of 2-diazo-1,2 dihydro-1-oxonaphthalenesulfonic acid or carboxylic acid chlorides. A list of well known and useful derivatives is included in the previously mentioned U.S. Pat. No. 5,858,626.

The infrared radiation absorbing dyes of the invention are those which have an absorption wavelength that is at its maximum in the region above the visible or ultraviolet region, i.e. above about 750 nm. More particularly, the dyes have a maximum absorption wavelength from about 800 to about 1100 nm. Most preferably, the imaging of the invention is carried out with an 830 nm laser so the maximum absorption wavelength should be in that region. Such compounds are well known in the art and commercially available. Classes of materials which are useful include, for example, squarylium, croconate, cyanine, phthalocyanine, merocyanine, chalcogenopyryloarylidene, oryindollizine, quinoid, indolizine and pyrylium. Other classes include thiazine, azulenium and xanthene dyes.

The coating of the invention is applied to a substrate using a suitable organic solvent and conventional coating procedures and equipment. Examples of two suitable solvents are acetone and 1-methoxy-2-propanol. As previously stated, the preferred substrate for a lithographic printing plate is grained and anodized aluminum although the invention is also applicable to other substrate materials. The thickness of the coating after drying on the substrate can be selected to vary widely but it is typically in the range of 0.5 to 2 microns.

The elements or plates of this invention are imageable using known digital laser imaging equipment. Following the laser imaging, the element or plate is developed using known alkaline developer solutions such as an aqueous solution of potassium silicate and potassium hydroxide to remove the solubilized, laser imaged, non-printing areas.

EXAMPLE 1

An 830 nm laser plate coating was prepared with an absorbing dye to diazonaphthoquinone weight ratio of 3:1 using the following formulation:

|  | weight % |
|---|---|
| Arcosolv PM solvent | 59.927 |
| Dimethyl formamide solvent | 9.244 |
| Ethanol solvent | 22.829 |
| KR 100 cresol formaldehyde resin | 7.402 |
| PS 105 diazonaphthoquinone sensitizer | 0.185 |
| 830A infra-red absorbing dye | 0.185 |
| KR 700 coloring dye | 0.148 |
| BYK 344 surfactant | 0.080 |

Note: PS 105 diazonaphthoquinone sensitizer is 33% diazonaphthoquinone and 67% phenolic resin.

The coating was applied to an aluminum substrate that was previously brush grained, anodized and silicated. The coat weight was 190 mg/ft$^2$. After coating, the plate was dried at 90° C. for four minutes. Next the plate was placed in a Creo Trendsetter imager equipped with a 20 watt 830 nm laser. The plate was imaged at a drum speed of 180 RPM and a laser power setting of 10 watts. On exiting the imager, the imaged plate was placed in a plate processor containing an alkaline developer. The processing speed was 4 ft/min with the following developer formulation:

| Potassium Silicate | 33 g |
|---|---|
| Potassium Hydroxide | 15 g |
| Water | 925 g |

After processing, the plate was placed on a sheet fed press and 50,000 good copies were printed.

EXAMPLE 2

An 830 nm laser plate coating was prepared at an absorbing dye to diazonaphthoquinone ratio of 12:1 using the following formulation:

|  | weight % |
|---|---|
| Arcosolv PM solvent | 59.927 |
| Dimethyl formamide solvent | 9.244 |
| Ethanol solvent | 22.829 |
| KR 100 cresol formaldehyde resin | 7.402 |
| PS 105 diazonaphthoquinone sensitizer | 0.074 |

-continued

|  | weight % |
| --- | --- |
| 830A infra-red absorbing dye | 0.296 |
| KR 700 coloring dye | 0.148 |
| BYK 344 surfactant | 0.080 |

The plate was coated, imaged and developed as in Example 1 and equally good copies were produced.

EXAMPLE 3

An 830 nm laser plate coating was prepared at an absorbing dye to diazonaphthquinone ratio of 3:2 using the following formulation:

|  | weight % |
| --- | --- |
| Arcosolv PM solvent | 59.927 |
| Dimethyl formamide solvent | 9.244 |
| Ethanol solvent | 22.829 |
| KR 100 cresol formaldehyde resin | 7.402 |
| PS 105 diazonaphthoquinone sensitizer | 0.247 |
| 830A infra-red absorbing dye | 0.123 |
| KR 700 coloring dye | 0.148 |
| BYK 344 surfactant | 0.080 |

The plate was coated, imaged and developed as in Example 1 and equally good copies were produced.

EXAMPLE 4

An 830 nm laser plate coating was prepared at an absorbing dye to diazonaphthquinone ratio of 1:2 using the following formulation:

|  | weight % |
| --- | --- |
| Arcosolv PM solvent | 59.927 |
| Dimethyl formamide solvent | 9.244 |
| Ethanol solvent | 22.829 |
| KR 100 cresol formaldehyde resin | 7.402 |
| PS 105 diazonaphthoquinone sensitizer | 0.317 |
| 830A infra-red absorbing dye | 0.053 |
| KR 700 coloring dye | 0.148 |
| BYK 344 surfactant | 0.080 |

The plate was coated, imaged and developed as in Example 1 and equally good copies were produced.

What is claimed is:

1. A positive-working infrared sensitive composition consisting essentially of:
   a. a mixture or a reaction product of a phenolic resin and an insolubilizing agent comprising an o-diazonaphthoquinone derivative;
   b. a compound that further insolubilizes said phenolic resin and absorbs infrared radiation,
   wherein the dry weight ratio of said infrared absorbing compound to the o-diazonaphthoquinone moiety of said o-diazonaphthoquinone derivative is greater than 1:5 and the amount of said o-diazonaphthoquinone moiety in the composition is less than 5 weight percent.

2. The composition as recited in claim 1 wherein said phenolic resin is a novolac resin.

3. The composition as recited in claim 1 wherein said o-diazonaphthoquinone derivative is an ester of o-diazonaphthoquinone.

4. A positive-working infrared sensitive composition consisting essentially of:
   a. a phenolic resin;
   b. a compound that absorbs infrared radiation and having a maximum absorbing wavelength greater than 750 nm and which also interacts with said phenolic resin to insolubilize said composition in an alkaline developer; and
   c. an o-diazonaphthoquinone derivative which interacts with said phenolic resin to further insolubilize said composition,
   wherein the dry weight ratio of said infrared absorbing compound to the o-diazonaphthoquinone moiety of said o-diazonaphthoquinone derivative is greater than 1:5 and the amount of said o-diazonaphthoquinone moiety in the composition is less than 5 weight percent.

5. The composition of claim 4 wherein said o-diazonaphthoquinone interacts with said phenolic resin by hydrogen bonding.

6. An infrared sensitive element comprising a substrate having a positive-working infrared sensitive coating thereon consisting essentially of:
   a. a mixture or a reaction product of a phenolic resin and an insolubilizing agent comprising an o-diazonaphthoquinone derivative;
   b. a compound that further insolubilizes said phenolic resin and absorbs infrared radiation,
   wherein the dry weight ratio of said infrared absorbing compound to the o-diazonaphthoquinone moiety of said o-diazonaphthoquinone derivative is greater than 1:5 and the amount of said o-diazonaphthoquinone moiety in the composition is less than 5 weight percent.

7. The element of claim 6 wherein said substrate is grained and anodized aluminum.

8. The element of claim 7 wherein said element is an imageable lithographic printing plate.

9. An infrared sensitive element consisting essentially of a substrate having a positive-working infrared sensitive coating thereon comprising:
   a. a phenolic resin;
   b. a compound that absorbs infrared radiation and having a maximum absorbing wavelength greater than 750 nm and which also interacts with said phenolic resin to insolubilize said composition in an alkaline developer; and
   c. an o-diazonaphthoquinone derivative which interacts with said phenolic resin to further insolubilize said composition,
   wherein the dry weight ratio of said infrared absorbing compound to the o-diazonaphthoquinone moiety of said o-diazonaphthoquinone derivative is greater than 1:5 and the amount of said o-diazonaphthoquinone moiety in the composition is less than 5 weight percent.

10. The element of claim 9 wherein said substrate is grained and anodized aluminum.

11. The element of claim 10 wherein said element is an imageable lithographic printing plate.

12. A method of forming a positive image on a lithographic printing plate comprising the steps of exposing a lithographic printing plate having an imageable coating on a substrate to a positive image of infrared radiation thereby forming soluble positive imaged areas in said coating and subjecting said exposed lithographic printing plate to an alkaline developing solution and removing said soluble imaged areas wherein said imageable coating is a positive-working infrared sensitive composition consisting essentially of:

a. a mixture or a reaction product of a phenolic resin and an insolubilizing agent comprising an o-diazonaphthoquinone derivative;

b. a compound that further insolubilizes said phenolic resin and absorbs infrared radiation, wherein the dry weight ratio of said infrared absorbing compound to the o-diazonaphthoquinone moiety of said o-diazonaphthoquinone derivative is greater than 1:5 and the amount of said o-diazonaphthoquinone moiety in the composition is less than 5 weight percent.

13. A method as recited in claim 12 wherein said phenolic resin is a novolac and wherein said o-diazonaphthoquinone is an ester which hydrogen bonds with said novolac resin.

14. A method as recited in claim 13 wherein said substrate is a grained and anodized aluminum plate.

* * * * *